United States Patent [19]

Araki et al.

[11] Patent Number: 4,686,509

[45] Date of Patent: Aug. 11, 1987

[54] DIGITAL TO ANALOG CONVERSION METHOD AND SYSTEM WITH THE INTRODUCTION AND LATER REMOVAL OF DITHER

[75] Inventors: Tetsuro Araki, Hachioji; Hiroyuki Onda, Hoya, both of Japan

[73] Assignee: Teac Corporation, Tokyo, Japan

[21] Appl. No.: 810,975

[22] Filed: Dec. 19, 1985

[30] Foreign Application Priority Data

Dec. 31, 1984 [JP] Japan .............................. 59-277690

[51] Int. Cl.⁴ ............................................ H03M 1/00
[52] U.S. Cl. ......................... 340/347 DA; 340/347 M
[58] Field of Search ............... 340/347 AD, 347 DA, 340/347 CC, 347 M

[56] References Cited

U.S. PATENT DOCUMENTS 3,562,420  2/1971  Thompson ..................... 375/111 X
3,999,129  12/1976  Kasson .................... 340/347 AD X

OTHER PUBLICATIONS

"The Application of Large Amplitude Dither to the Quantization of Wide Range Audio Signals", Yoshio Yamasaki, The Journal of the Acoustical Society of Japan, vol. 39, No. 3, 1983.

*Primary Examiner*—T. J. Sloyan
*Attorney, Agent, or Firm*—Woodcock Washburn Kurtz Mackiewicz & Norris

[57] ABSTRACT

A digital data signal such as a digitized audio signal is time division multiplexed with a digital dither signal to provide a multiplex signal compound of the digital dither signal and a digital data/dither signal, the latter being an addition of the digital data and dither signals. Then the multiplex signal is converted from digital to analog form by one and the same digital to analog converter. The subsequent removal of the analog dither signal from the analog data/dither signal provides an analog data signal as a replica of the digital data signal. The use of the same converter for the conversion of both dither signal and data/dither signal from digital to analog form makes possible the maximum possible removal of the dither from the analog data/dither signal.

10 Claims, 5 Drawing Figures

DIGITAL TO ANALOG CONVERSION METHOD AND SYSTEM WITH THE INTRODUCTION AND LATER REMOVAL OF DITHER

BACKGROUND OF THE INVENTION

Our invention relates to the conversion of electric signals from digital to analog form. More specifically, our invention concerns a method of, and means for, translating a digitized audio signal or like digital data signal into an equivalent analog signal with the addition of dither (an artificially created white noise signal) to the digital data signal and subsequent removal of the dither from the analog data signal for the reduction of noise and distortion.

The pulse code modulation (PCM) or digital processing of audio signals has become, or is becoming, the mainstream of high fidelity sound recording and reproduction with the advent and ever increasing commercial acceptance of compact discs (CDs). There are, however, some problems left unsolved in the area of digital sound processing. One of these is the "quantization noise", that is, the differences between the samples of the music wave and the quantized values of the samples. The quantization noise becomes particularly pronounced, distorting the reproduced sound as higher harmonics, when the input signal level is low and there are only a small number of quantization steps. Even when the input signal level is high, the quantization noise will distort the signal if it changes slowly.

A conventional solution to this quantization noise problem has been the use of dither, intended to turn the quantization noise into white noise which hardly affects the appreciation of the reproduced sound. A digital dither signal is superposed on the audio signal prior to its digital to analog conversion and is removed from the analog audio signal following the conversion. This technique is disclosed for example in the article entitled "The Application of Large Amplitude Dither to the Quantization of Wide Range Audio Signals" by Yoshio Yamasaki in *The Journal of the Acoustical Society of Japan*, Vol 39, No. 7, published 1983.

We will now discuss two familiar examples of digital to analog conversion systems relying on dither for the suppression of quantization noise. One such known system adds a dither signal, digitized by an analog to digital (A/D) converter on being put out by a dither generator, to a digital audio or data signal. The data and dither are then converted by a digital to analog (D/A) converter into analog form. Then the analog data and dither signal is fed through a low pass filter into a subtracter circuit, to which is also supplied the analog dither signal directly from the dither generator for subtracting the analog dither from the analog data and dither signal. We object to this known system because of the time difference between the dither fed directly from the dither generator to the substracter circuit and the dither delivered thereto with the data signal via the A/D converter, adder, D/A converter, low pass filter, and substracter. The time difference makes impossible the complete removal of the dither from the data signal.

Another known system employs an additional D/A converter which has its input connected to the dither generator via the A/D converter and its output to the subtracter, with a view to the elimination of the noted time difference. The low pass filter is connected to the output of the subtracter, instead of to its input as in the first recited prior art system. Thus, on being put out by the dither generator, the dither is fed to one input of the subtracter via the A/D converter, adder, and first D/A converter on one hand and, on the other hand, to the other input of the subtracter via the A/D converter and second D/A converter. Theoretically, the dither signals to both inputs of the subtracter are in phase, so that the dither is thoroughly removable from the analog data signal. In practice, however, it is nearly impossible to provide two D/A converters of exactly the same constructional details and the same performance characteristics. The different converters will give rise to different conversion errors, with the result that some dither component remain unremoved from the analog data signal to manifest itself as noise or distortion upon sound reproduction.

SUMMARY OF THE INVENTION

We have hereby discovered how to add dither to, and completely remove the same from, the desired audio or like data signal for faithfully reconstructing the analog equivalent of the digital data signal, by use of relatively simple and thoroughly practicable means.

According to our invention, briefly stated in one aspect thereof, there is provided a method of faithfully converting a digital data signal such as a digitized audio signal into an analog signal. The method comprises time division multiplexing a digital dither signal and a digital data/dither signal, the latter being an addition of the digital data signal and the digital dither signal. Then the multiplexed digital dither signal and digital data/dither signal is converted into analog form by means of one and the same D/A converter. Then the analog dither signal is removed from the analog data/dither signal to obtain an analog data signal corresponding to the digital data signal.

Another aspect of our invention concerns a digital to analog converting system for carrying the above summarized method into practice. The system comprises time division multiplexing means connected both to input means, for receiving a digital data signal, and to a source of a digital dither signal for time division multiplexing the digital dither signal and the digital data/dither signal. A D/A converter is connected to the time division multiplexing means for converting the multiplexed dither signal and data/dither signal from digital to analog form to provide an output comprised of an analog dither signal and an analog data/dither signal. Connected to the D/A converter are dither removing circuit means for removing the analog dither signal from the analog data/dither signal to provide an analog data signal corresponding to the digital data signal.

It should be noted that the dither signal and the data/dither signal are time division multiplexed for conversion from digital to analog form by the same D/A converter. There is accordingly no difference between the conversion errors of the dither signal and those of the data/dither signal, resulting in the remarkable curtailment of noise or distortion. There can be utilized, of course, the analog dither signal extracted from the output from the D/A converter for the complete removal of the dither signal from the data/dither signal following the digital to analog conversion.

The above and other features and advantages of our invention and the manner of realizing them will become more apparent, and the invention itself will best be understood, from a study of the following description and appended claims, with reference had to the at-

DETAILED DESCRIPTION

Figure 1:
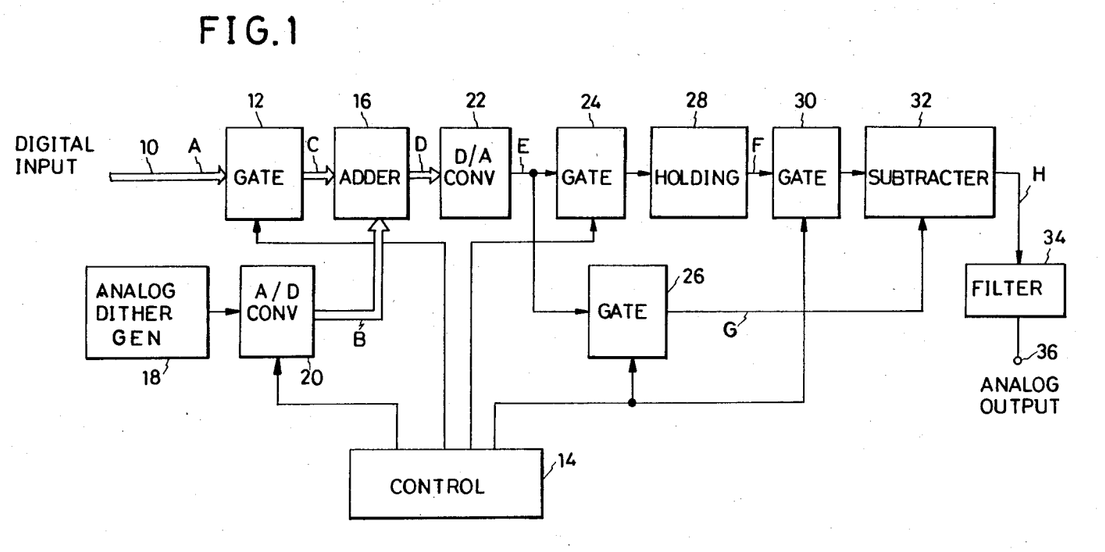
FIG. 1 is a block diagram of the digital to analog conversion system embodying the principles of our invention.

We will now describe our invention in terms of a first preferable embodiment thereof given in FIG. 1, in which the digital to analog conversion of our invention is shown adapted for use in a DC player. In the course of the discussion of FIG. 1 we will refer also to FIG. 2 which plots at (A) through (H) the signals useful in explaining the operation of the FIG. 1 system. In FIG. 1 we have indicated by the same capitals (A) through (H) the parts where the corresponding signals of FIG. 2 appear, for a better understanding of our invention.

The reference numeral 10 in FIG. 1 denotes an input path for the digital data signal to be transformed into an equivalent analog signal. We are using the term "data signal" to mean any such signal that can be processed by the method and means of our invention. The particular data signal to be processed by the system of FIG. 1 is an audio signal that has been digitized by the PCM scheme. The digital data signal may be of, for example, 16 bit format, with the bits fed over the input path 10 in parallel form. We understand that a conventional sampling circuit, not shown, is connected in the preceding stage of the input path 10, sampling the data signal X as indicated at (A) in FIG. 2, with a predetermined sampling period T. The sampling rate may be 88.2 kilohertz. Each sample is input during a predetermined part T' of one sampling period T, although T' may be equal to T. The value of the data signal X remains the same at least during each sampling period.

The input path 10 is connected to a gate circuit 12 for gating the digital data signal X under the control of a control circuit 14. The output from this gate circuit 12 is given at (c) in FIG. 2. It will be observed that the gate circuit 12 allows the passage therethrough of the digital data signal X during a predetermined division T1 (from moment t0 to moment t1), herein shown as a first half by way of example only, of the part T' of each sampling period T. The control circuit 14 applies a gating pulse to the gate circuit 12 during such a division T1 of each sampling period T.

The gate circuit 12 is connected to one input of an adder circuit 16, to another input of which is connected an analog dither generator 18 via an A/D converter 20. The dither generator 18 produces an analog dither (white noise) signal composed of various frequency components ranging from zero to 300 kilohertz. The A/D converter 20 samples and digitizes the analog dither signal from the generator 18 and puts out a digital dither signal Y as at (B) in FIG. 2. This A/D converter has a control input coupled to the control circuit 14 to receive therefrom a series of sampling pulses each having a duration T' (sampling rate 88.2 kilohertz), so that the samples of the digital dither signal Y are in synchronism with those of the digital data signal, as will be seen from (A) and (B) in FIG. 2. The digital dither signal Y may be of lower level than the digital data signal X and may be of 16 bits format, with the bits of each word fed to the adder circuit 16 in parallel relation to one another.

The adder circuit 16 adds, bit by bit, the digital data signal X of 16 bits format from the gate circuit 12 and the digital dither signal Y of 16 bits format from the A/D converter 20. The digital data signal X is fed from the gate circuit 12 during the first division T1 of the part T' of each sampling period T, as at (C) in FIG. 2. The digital dither signal Y, on the other hand, is fed from the A/D converter 20 during the part T' (from moment t0 to moment t2) of each sampling period T, as at (B) in FIG. 2. The resulting output from the adder circuit 16 is therefore as depicted at (D) in FIG. 2. The adder circuit 16 puts out what we call a digital data/dither signal X+Y (i.e. an addition of the digital data and dither signals) during the first division T1 of the part T' of each sampling period T, and the digital dither signal Y during a second division T2 (from moment t1 to moment t2) of each sampling period part T'. We have thus accomplished the time division multiplexing of the digital data/dither signal X+Y and digital dither signal Y. It will be understood that the gate circuit 12 and adder circuit 16 consitute the means for such multiplexing of the signals.

Connected to the output of the adder circuit 16 is a D/A converter 22 comprising a ladder connection of resistors for converting the multiplexed data/dither signal X+Y and dither signal Y from digital to analog form. The output from this converter is as represented at (E) in FIG. 2. It comprises an analog data/dither signal X'+Y' during the first division T1 of each sampling period part T', and an analog dither signal Y' during the second division T2 of each sampling period part T'.

The output of the D/A converter 22 is connected to two additional gate circuits 24 and 26. One 24 of these gate circuits is intended to derive the analog data/dither signal X'+Y', and the other gate circuit 26 to derive the analog dither signal Y' from the multiplex output signal from the D/A converter 22. We will therefore refer to the gate circuit 24 as the data/dither gate circuit, and to the other gate circuit 26 as the dither gate circuit.

The data/dither gate circuit 24 receives gating pulses from the control circuit 14, each pulse having a duration from moment t0 to moment t1. Only the analog data/dither signal X'+Y' of the multiplex output from the D/A converter 22 is therefore permitted to pass through the data/dither gate circuit 24 during the first division T1 of each sampling period part T'. The data/dither gate circuit 24 applies the extracted analog data/dither signal X'+Y' to a holding circuit 28, which holds each input sample until the next sampling moment t3. The output from this holding circuit is therefore as shown at (F) in FIG. 2.

The dither gate circuit 26, on the other hand, receives from the control circuit 14 gating pulses each lasting from moment t1 to moment t2. Only the analog dither signal Y' contained in the multiplex output from the D/A converter 22 is thus allowed to pass through the dither gate circuit 26, as indicated at (G) in FIG. 2.

The holding circuit 28 has its output coupled to an additional data/dither gate circuit 30 which has its control input connected also to the control circuit 14. Each gating pulse delivered from the control circuit 14 to the data/dither gate circuit 30 lasts from moment t1 to moment t2, that is, during the second division T2 of each sampling period part T'. Consequently, the data/dither gate circuit 30 selects only that portion of the incoming analog data/dither signal which is input during the second division T2 of each sampling period part T'.

A subtracter circuit 32 has two inputs connected to the data/dither gate circuit 30 and to the dither gate circuit 26. Subtracting the analog dither signal Y', fed from the dither gate circuit 26, from the analog data/dither signal X'+Y' fed from the data/dither gate circuit 30, the subtracter circuit 32 puts out the desired analog data signal X'. As plotted at (H) in FIG. 2, the subtracter circuit 32 produces the analog data signal X' only during the second division T2 of each sampling period part T'.

A filter 34 is provided on the output side of the subtracter circuit 32 for making continuous the discrete values of the analog data signal X' as they are fed from the subtracter circuit. The continuous analog data signal X' is thus delivered through a system output 36 as a replica of the incoming digital data signal X.

Figure 2:
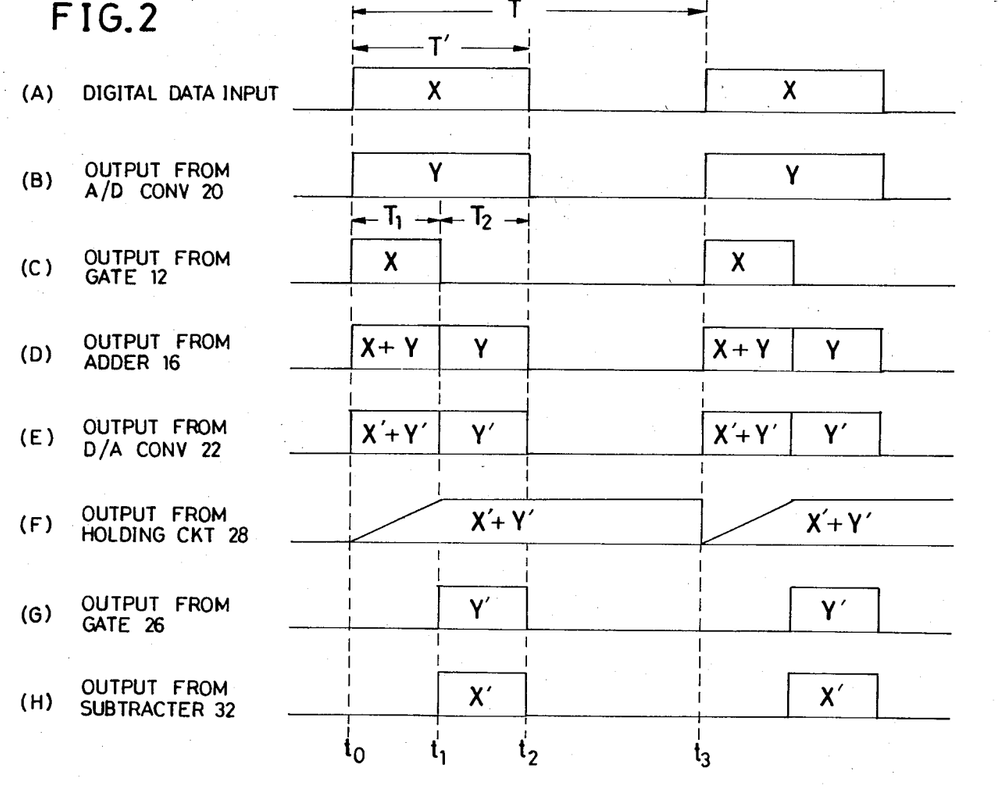
FIG. 2 is a timing diagram showing in proper time relationship the signals appearing in the various parts of the system of FIG. 1 in order to explain its operation.

One of the features of the digital to analog conversion system of FIG. 1 is the time division multiplexing of the digital data/dither signal X+Y and digital dither signal Y, as we have explained with reference to (D) in FIG. 2. The multiplexed digital data/dither signal X+Y and digital dither signal Y are converted into analog signals by the same D/A converter 22 and, in consequence, without any difference between the conversion errors of the data/dither signal and those of the dither signal; in other words, the two signals are converted with the same conversion errors.

Another feature of the FIG. 1 system is that the subtracter circuit 32 uses the analog dither signal that has been derived from the analog data/dither signal, for removing the dither component therefrom. Toward this end the multiplex analog output from the D/A converter 22 is divided into the data/dither signal X'+Y' and the dither signal Y' by the gate circuits 24 and 26, preparatory to delivery to the subtracter circuit 32. Since the two outputs to the subtracter circuit 32 are derived from the output from the same D/A converter 22, the dither component is completely removable from the analog data/dither signal without the difficulties previously set forth in conjunction with the prior art. We have thus succeeded in the drastic curtailment of noise or distortion in the reproduction of the analog audio signal that has been reconstructed from its digital equivalent.

We would like to point out an additional advantage of the FIG. 1 system, that is, that its analog output is free from the offset voltage (the output voltage appearing when the input level is zero) of the D/A converter 22. Let Vo be the offset voltage of the D/A converter 22. Upon conversion of the data/dither signal X+Y from digital to analog form by the D/A converter 22, its output can be expressed as X'+Y'+Vo. Likewise, upon conversion of the dither signal Y from digital to analog form by the same D/A converter 22, its output can be written as Y'+Vo. The subtracter circuit 32 performs the operation, $$(X'+Y'+Vo)-(Y'+Vo)=X',$$

so that not only the dither component Y' but also the offset voltage component vO is removed for the provision of the analog data signal X' faithfully representing the digital input X.

SECOND FORM

Figure 3:
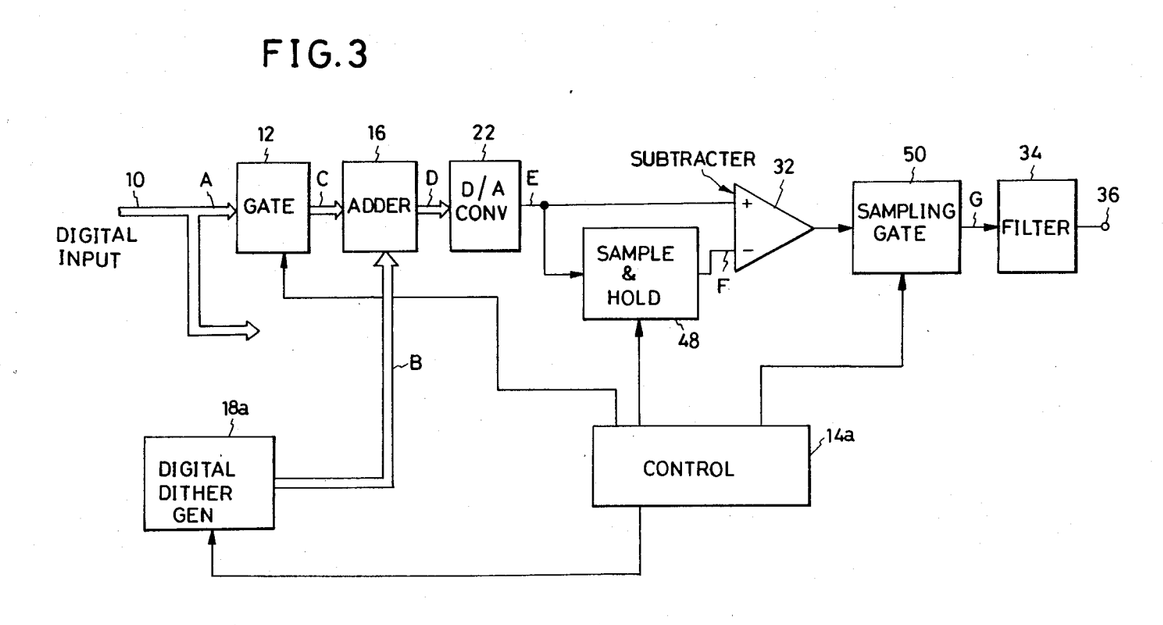
FIG. 3 is a block diagaram of another preferred form of the digital to analog conversion system in accordance with our invention.

We have illustrated in FIG. 3 another preferred form of the digital to analog conversion system in accordance with our invention. This second system also comprises the gate circuit 12, the adder circuit 16, and the D/A converter 22, which are coupled to the input digital data signal path 10 as in the preceding embodiment. We assume that the input data signal in this case is a digital stereophonic audio signal. FIG. 3 shows, however, the means for the digital to analog conversion of one channel of the stereophonic audio signal, it being understood that the other channel can be so converted by like means. The gate circuit 12 is under the control of a control circuit 14a having slightly different control functions from those of the control circuit 14 of the FIG. 1 system.

The adder circuit 16 has another input coupled directly to a digital dither generator 18a which generates and puts out a digital dither signal identical with that produced by the A/D converter 20 of the FIG. 1 system. The digital dither generator 18a can be the prior art circuit known as the maximum length pseudorandom pulse generator illustrated in FIG. 4.

Figure 4:
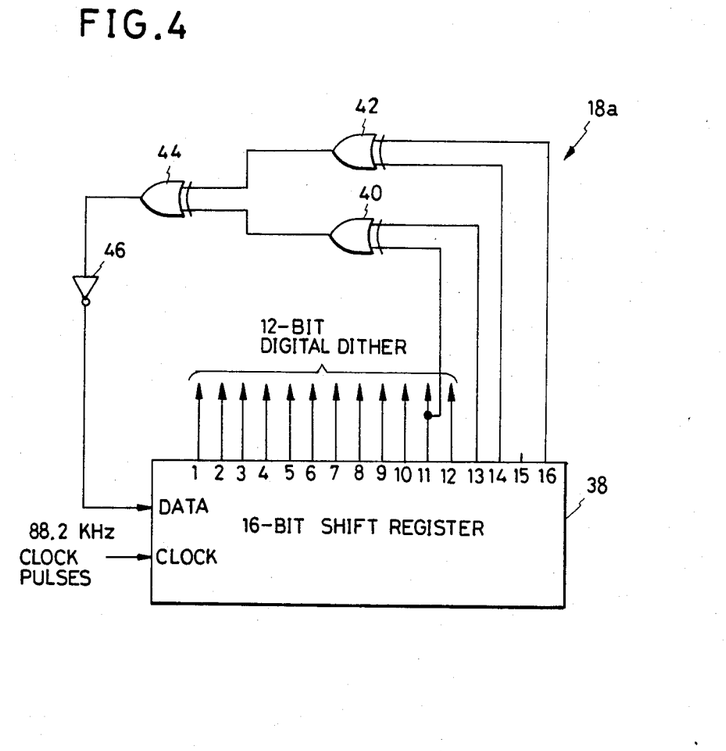
FIG. 4 is a schematic electrical diagram showing in more detail the digital dither generator included in the system of FIG. 3.

The exemplified digital dither generator 18a of FIG. 4 comprises a 16 bits shift register 38, three exclusive OR gates 40, 42 and 44, and a NOT circuit 46. The shift register 38 has first to 16th output terminals indicated at (1) through (16) respectively. The 11th and 13th output terminals are connected respectively to the two inputs of the first exclusive OR gate 40, whereas the 14th and 16th output terminals are connected respectively to the two inputs of the second exclusive OR gate 42. The outputs of the two OR gates 40 and 42 are connected respectively to the two inputs of the third exclusive OR gate 44. The output of this third OR gate is connected to the data input of the shift register 38 via the NOT circuit 46. The shift register 38 has a clock input connected to a clock, not shown, which generates pulses with a recurrence rate of, say, 88.2 kilohertz.

With the impression of each clock pulse to the shift register 38 a different set of pseudorandom pulses are delivered from its 16 outputs. It takes $(2^n-1)$ clock pulses, where n is the number of the bits of the shift register 38, for this shift register to complete the delivery of one cycle of such different sets of pulsels. Thus one cycle of the digital signal from the 16 outputs of the shift register 38 is $(2^n-1)$ times, or $(2^{16}-1)$ times in the present case, one cycle of the clock pulses. This cycle of the pseudoramdom pulses is so long in comparison with the cycles of the analog data signal in question that the pulses can be thought of as being nonperiodic with respect to the data signal. We have therefore employed the substantially random 12 bits digital signal from the first to 12th output terminals of the shift register 38 as the digital dither signal as being equivalent to a white noise signal.

With reference back to FIG. 3 the digital dither generator 18a puts out the digital dither signal in synchronism with the digital data signal under the control of the control circuit 14a, for delivery to the adder circuit 16.

The D/A converter 22 has its output connected directly to the positive input of the subtracter circuit 32 on one hand and, on the other hand, to its negative input via a sample and hold circuit 48 under the control of the control circuit 14a. Just like its counterpart in the FIG. 1 system the subtracter circuit 32 functions to subtract the analog dither signal, fed from the sample and hold circuit 48, from the multiplex analog data/dither signal and dither signal delivered from the D/A converter 22. The subtracter circuit 32 has its output connected to a sampling gate circuit 50 which, as dictated by the control circuit 14a, operates to extract the analog data signal from the output from the subtracter circuit. Connected to the output of the sampling gate circuit 50, the low pass filter 34 is effective to interpolate the incoming intermittent analog data signal. The filter 34 is coupled to the system output 36.

Figure 5:
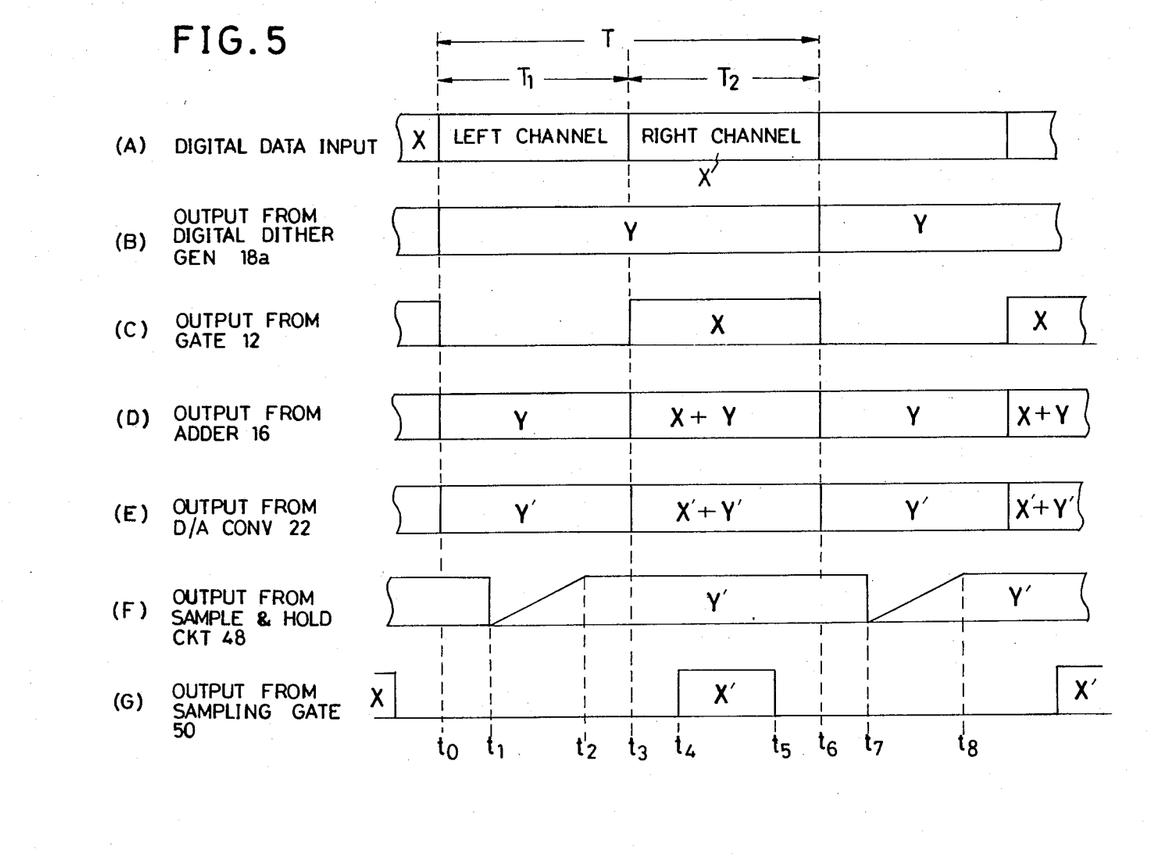
FIG. 5 is a timing diagram showing in proper time relationship the signals appearing in the various parts of the system of FIG. 3 in order to explain its operation.

We have indicated in FIG. 5 the various signals, designated (A) through (G), appearing in those parts of the FIG. 3 system which are identified by the same capitals, for a better understanding of the following operational description of this system. At (A) in FIG. 5 is shown the digital stereophonic audio (data) signal X fed over the input path 10 to be converted into analog form by the FIG. 3 system. The digital input signal X is a time division multiplexing of a left channel data signal, transferred during the first division T1 (from moment t0 to moment t3) of each sampling period T, and a right channel data signal transferred during the second division T2 (from moment t3 to moment t6) of each sampling period T. As shown at (B) in FIG. 5, the digital dither generator 18a generates and puts out the digital dither signal Y, composed of succesive sets of pseudo-random pulses, with the same sampling rate as the data signal X. Of course, both data signal X and dither signal Y retain the same values at least during each sampling period T.

The gate circuit 12 inputs from the control circuit 14a gating pulses each lasting as from moment t3 to moment t6, so that only the right channel data signal X is permitted to pass the gate circuit 12 during the second division T2 of each sampling period T. The thus gated right channel data signal is converted from digital to analog form by the means of FIG. 3, whereas the left channel data signal is to be likewise converted by similar means which we have not shown for the simplicity of illustration.

The adder circuit 16 adds in parallel the 12 bits digital dither signal Y of FIG. 5(B) and the 16 bits digital data signal X of FIG. 5(C), to put out the time division multiplex signal given at (D) in FIG. 5. The multiplex output from the adder circuit 16 comprises the digital dither signal Y during the first division T1 of each sampling period T and the digital data/dither signal X+Y during the second division T2 of each sampling period. As in the FIG. 1 embodiment, the data/dither signal X+Y results from the addition of the right channel data signal X and the dither signal Y.

The adder circuit 16 delivers its multiplex output to the D/A converter 22, so that the latter produces the corresponding analog output represented at (E) in FIG. 5. The multiplex analog output from the D/A converter 22 comprises an analog dither signal Y' and an analog data/dither signal X'+Y'.

The D/A converter 22 delivers its multiplex analog output both to the positive input of the subtracter circuit 32 and to the sample and hold circuit 48. The sample and hold circuit 48 samples the incoming multiplex analog output as from moment t1 to moment t2 during each sampling period T. The interval from moment t1 to moment t2 is included in the first division T1 of each sampling period T, during which the D/A converter 22 puts out the analog dither signal Y', as will be observed from (E) in FIG. 5. Consequently, the sample and hold circuit 48 extracts the analog dither signal Y' from the multiplex output from the D/A converter 22 and holds each sample until the next sampling from moment t7 to moment t8. The output from the sample and hold circuit 48 is therefore as shown at (F) in FIG. 5 and is delivered to the negative input of the subtracter circuit 32.

Thus the subtracter circuit 32 subtracts the analog dither signal Y' of FIG. 5(F) from the multiplex analog data/dither signal X'+Y' and analog dither signal Y' of FIG. 5(E). Although we have not shown the resulting output from the subtracter circuit 32, it will be seen from the comparison of (E) and (F) in FIG. 5 that the subtracter output comprises the analog data signal X' during the second division T2 (from moment t3 to moment t6) of each sampling period T.

As we have stated in connection with the FIG. 1 embodiment, the output from the subtracter circuit 32 is free from the possible offset voltage of the D/A converter 22. This is because both inputs to the subtracter circuit contain such possible offset voltage. However, the analog dither signal Y' from the sample and hold circuit 48 is such that the subtracter output may contain extraneous signal components other than the desired analog data signal X'. We have therefore employed in this alternative embodiment the sampling gate circuit 50 for the elimination of such undesirable signal components. Under the control of the control circuit 14a the sampling gate circuit 50 samples the analog data signal X' from moment t4 to moment t5 during the second division T2 of each sampling period T, with the resulting output shown at (G) in FIG. 5. Each sample of the analog data signal X' put out by the sampling gate circuit 50 will be free from glitches or the like that may have been contained in the subtracter output in the vicinities of the opposite extreme moments t3 and t6 of the second division T2 of each sampling period T.

These samples of the analog data signal X' are interpolated by the low pass filter 34 into the complete analog signal preparatory to reproduction as audible sound.

Thus, in this alternative embodiment, as in the FIG. 1 embodiment, the digital data/dither signal X+Y and digital dither signal Y are time multiplxed and converted into analog form by the same D/A converter 22. Further the subtracter circuit 32 removes the analog dither signal from the analog multiplex signal by utilizing the analog dither signal that has been extrated from the analog multiplex signal itself by the sample and hold circuit 48. It is therefore apparent that this FIG. 3 embodiment gains the same advantages as those set forth in connection with that of FIG. 1.

Possible Modifications

Although we have shown and described our invention in terms of but two preferable embodiments thereof, we recognize, of course, that our invention could be embodied in other forms within the broad teaching hereof. It will also be apparent that our invention is adaptable for the digital to analog conversion of not only audio signals but also video and a variety of other signals. The following is a brief list of possible modifications or alterations of the illustrated embodiments which we believe fall within the scope of our invention:

1. The gate circuit 12 in both FIGS. 1 and 3 embodiments could be connected on the output side of the adder circuit 16 for gating the digital data/dither signal put out by the adder circuit. Further, in this case, a sampling gate might be connected between the A/D converter 20 of FIG. 1, or the digital dither generator 18a of FIG. 3, and the D/A converter 22 for sampling the digital dither signal. Then the digital data/dither signal and the digital dither signal would be input to the D/A converter 22 by time division multiplexing.

2. In the system of FIG. 3 the sample and hold circuit 48 might be adapted for sampling and holding the analog data/dither signal, instead of the analog dither signal, and the sampling gate circuit 50 might be rendered conductive as from moment t5 to moment t6 in FIG. 5.

We claim:

1. A method of faithfully converting a digital data signal such as a digitized audio signal into an analog signal, which comprises:
   (a) generating a digital dither signal;
   (b) time division multiplexing the digital dither signal and a digital data/dither signal, the latter being formed by adding the digital data signal and the digital dither signal;
   (c) converting the multiplexed digital dither signal and digital data/dither signal into an analog dither signal and an analog data/dither signal by means of one and the same digital to analog converter;
   (d) holding either of the analog dither signal and the analog data/dither signal for synchronization with the other; and
   (e) removing the analog dither signal from the analog data/dither signal to obtain an analog data signal corresponding to the digital data signal.

2. The digital to analog converting method of claim 1 wherein the digital data signal is supplied in parallel bit form and with a predetermined sampling period, wherein the digital dither signal is also supplied in parallel bit form, and wherein the time division multiplexing of the digital dither signal and the digital data/dither signal is accomplished by:
   (a) gating the digital data signal to select its portion during a first of two predetermined divisions of each sampling period of the digital data signal; and
   (b) adding the gated digital signal and the digital dither signal whereby the digital data/dither signal is transmitted during the first of the two predetermined divisions of each sampling period of the digital data signal, and the digital dither signal during a second of the two predetermined divisions of each sampling period.

3. A system for faithfully converting a digital data signal such as a digitized audio signal into an analog signal, comprising:
   (a) input means for receiving the digital data signal;
   (b) a source of a digital dither signal;
   (c) time division multiplexing means connected both to the input means and to the source for time division multiplexing the digital dither signal and a digital data/dither signal, the latter being an addition of the digital data signal and the digital dither signal;
   (d) a digital to analog converter connected to the time division multiplexing means for converting the multiplexed dither signal and data/dither signal from digital to analog form to provide an output comprised of an analog dither signal and an analog data/dither signal; and
   (e) dither removing circuit means connected to the digital to analog converter for removing the analog dither signal from the analog data/dither signal to provide an analog data signal corresonponding to the digital data signal, said dither removing circuit means comprising:
   a sample and hold circuit connected to the digital to analog converter for extracting, and holding, the analog dither signal from the analog data/dither signal and analog dither signal put out by the digital to analog converter;
   a subtracter circuit connected to both the digital to analog converter and the sample and hold circuit for subtracting the analog dither signal, delivered from the sample and hold circuit, from the analog data/dither signal and analog dither signal delivered form the digital to analog converter; and
   a sampling gate circuit connected to the subtracter circuit for extracting the analog data signal from the output from the subtracter circuit.

4. The digital to analog converting system of claim 3 further comprising a low pass filter for making continuous the analog data signal put out intermittently by the sampling gate circuit.

5. A system for faithfully converting a digital data signal such as a digitized audio signal into an analog signal, comprising:
   (a) input means for receiving the digital data signal;
   (b) a source of a digital dither signal;
   (c) time division multiplexing means connected both to the input means and to the source for time division multiplexing the digital dither signal and a digital data/dither signal, the latter being an addition of the digital data signal and the digital dither signal;
   (d) a digital to analog converter connected to the time division multiplexing means for converting the multiplexed dither signal and data/dither signal from digital to analog form to provide an output comprised of an analog dither signal and an analog data/dither signal;
   (e) holding means connected to the digital to analog converter for holding either of the analog dither signal and the analog data/dither signal for synchronization with the other; and
   (f) dither removing circuit means connected both to the digital to analog converter and the holding means for removing the analog dither signal from the analog data/dither signal to provide an analog data signal corresponding to the digital data signal.

6. The digital to analog converting system of claim 5 wherein the source of the digital dither signal comprises:
   (a) a source of an analog dither signal; and
   (b) an analog to digital converter for converting the dither signal from analog to digital form.

7. The digital to analog converting system of claim 5 wherein the source of the digital dither signal comprises a maximum sequence pseudorandom digital pulse generator.

8. A system for faithfully converting a digital data signal such as a digitized audio signal into an analog signal, comprising:
   (a) input means for receiving the digital data signal;

(b) a source of digital dither signal;

(c) time division multiplexing means connected both to the input means and to the source for time division multiplexing the digital dither signal and a digital data/dither signal, the latter being an addition of the digital data signal and the digital dither signal;

(d) a digital to analog converter connected to the time division multiplexing means for converting the multiplexed dither signal and data/dither signal from digital to analog form to provide an output comprised of an analog dither signal and an analog data/dither signal; and (e) dither removing circuit means connected to the digital to analog converter for removing the analog dither signal from the analog data/dither signal to provide an analog data signal corresponding to the digital data signal, said dither removing circuit means comprising;

a first gate circuit connected to the digital to analog converter for extracting the analog data/dither signal from the output therefrom;

a holding circuit connected to the first gate circuit for holding the extracted analog data/dither signal;

a second gate circuit connected to the digital to analog converter for extracting the analog dither signal from the output therefrom;

a third gate circuit connected to the holding circuit for causing the passage therethrough of the analog data/dither signal in synchronism with the extraction of the analog dither signal by the second gate circuit; and a subtracter circuit connected to both the second and third gate circuits for subtracting the analog dither signal from the analog data/dither signal.

9. The digital to analog converting system of claim 8 further comprising a filter for making continuous the analog data signal put out intermittently by the subtracter circuit.

10. The digital to analog converting system of claim 5 wherein the input means is adapted to input the digital data signal in parallel bit form, the digital data signal being supplied with a predetermined sampling period, wherein the source generates the digital dither signal in parallel bit form, and wherein the time division multiplexing means comprises:

(a) a gate circuit connected to the input means for permitting the passage therethrough of the digital data signal only during a first of two predetermined divisions of each sampling period of the digital data signal; and (b) an adder circuit connected to both the gate circuit and the source for adding the outputs therefrom, the adder circuit putting out the digital data/dither signal during the first of the two predetermined divisions of each sampling period of the digital data signal and the digital dither signal during a second of the two predetermined divisions of each sampling period of the digital data signal.

* * * * *